United States Patent [19]
Guddanti et al.

[11] Patent Number: 5,179,631
[45] Date of Patent: Jan. 12, 1993

[54] NEURAL NETWORK LOGIC SYSTEM

[75] Inventors: Suresh Guddanti; William P. Mounfield, Jr., both of Baton Rouge, La.

[73] Assignee: Board of Supervisors of Louisiana State University and Agricultural and Mechanical College, Baton Rouge, La.

[21] Appl. No.: 589,164

[22] Filed: Sep. 27, 1990

[51] Int. Cl.$^5$ .......................... H03M 1/38; G06J 1/06
[52] U.S. Cl. ........................................ 395/27; 395/22; 364/602
[58] Field of Search .................. 364/513, 602; 395/27, 395/22

[56] References Cited

U.S. PATENT DOCUMENTS 4,751,666  6/1988  Gillingham .......................... 364/602

OTHER PUBLICATIONS

"A Truth Maintenance System," J. Doyle, Artificial Intelligence, vol. 12, pp. 231-272, (1979).

"Inexact Reasoning in Expert Systems: A Stochastic Parallel Network Approach," Venkatasubramanian, IEEE Computer Society Conference on AI Applications, pp. 13-15 (1985).

"Adaptive Inference in Fuzzy Knowledge Networks," B. Kosko, IEEE First International Conference on Neural Networks, pp. II-261-268, (Jun. 1987).

"Computing With Neural Circuits: A Model," J. Hopfield and D. Tank, Science, vol. 233, pp. 625-632 (1986).

Primary Examiner—Allen R. MacDonald
Assistant Examiner—George Davis
Attorney, Agent, or Firm—John H. Runnels

[57] ABSTRACT

A novel neural network implementation for logic systems has been developed. The neural network can determine whether a particular logic system and knowledge base are self-consistent, which can be a difficult problem for more complex systems. Through neural network hardware using parallel computation, valid solutions may be found more rapidly than could be done with previous, software-based implementations. This neural network is particularly suited for use in large, real-time problems, such as in a real-time expert system for testing the consistency of a programmable process controller, for testing the consistency of an integrated circuit design, or for testing the consistency of an "expert system." This neural network may also be used as an "inference engine," i.e., to test the validity of a particular logical expression in the context of a given logic system and knowledge base, or to search for all valid solutions, or to search for valid solutions consistent with given truth values which have been "clamped" as true or false. The neural network may be used with many different types of logic systems: those based on conventional "truth table" logic, those based on a truth maintenance system, or many other types of logic systems. The "justifications" corresponding to a particular logic system and knowledge base may be permanently hardwired by the manufacturer, or may be supplied by the user, either reversibly or irreversibly.

13 Claims, 2 Drawing Sheets

NEURAL NETWORK LOGIC SYSTEM

BACKGROUND OF THE INVENTION

This invention pertains to hardware-implemented logic systems, particularly as implemented in a neural network.

A neural network is a set of computational units whose interconnections are analogous to biological neurons. In general, any model or circuit which resembles in some way the interconnections of biological neurons can be called a neural network. Each computational unit comprises a neuron, one or more inputs, and one or more outputs. An input for one neuron may be connected to an output of another neuron. In some cases, a neuron may receive direct feedback by connecting one of its inputs to one of its own outputs. Classical neural networks are those which learn facts or patterns, and which show associative recall of the stored patterns.

Even though humans are good at logic, and though some neural networks have been modeled after human neural systems, there has been little research in the design of neural networks to solve logic problems. There are limits on the size of a logic problem which the human brain can solve in a given time. An attractive characteristic of neural networks is their scalability. There is in theory no limit to the complexity of a neural network.

Consider a logic system containing a finite number of facts. A fact can have one of two truth values-"true" or "false." Let the truth value of each fact be dependent on a finite number of rules. Each rule may depend upon the truth values of some or all of the facts. The truth value for a fact is said to be "justified" if at least one rule associated with that fact is satisfied. If the truth values of all facts are justified, then the set of all truth values is said to be consistent.

A truth maintenance system (TMS) is a particular type of logic system which solves for a consistent set of truth values from a current set of facts stored in a knowledge base. The knowledge base contains rules for determining truth values of the facts. A rule in a TMS is a set of truth values which necessarily imply that a particular fact is true. See, e.g., Jon Doyle, "A Truth Maintenance System," *Artificial Intelligence*, Vol 12, pp 231-272 (1979), which is incorporated by reference.

Prior TMS systems, such as described by Doyle, supra, have used a recursive labelling algorithm to reach at a correct combination of the truth values corresponding to the facts stored in the system. In practice the number of facts that can be stored in a TMS system is very large. For a set of N formulas, there are $2^N$ possible combinations of true/false values, of which generally only a few combinations will be solutions. Given a set of formulas (or facts), the labelling algorithm fits true/false values to each formula to find solutions.

Existing software implementations of TMS systems are relatively slow, because of the large number of total possible true/false combinations, and the generally small number of such combinations which are solutions. To the knowledge of the inventors, there have been no previous logic systems implemented in neural network hardware.

Venkatasubramanian, "Inexact Reasoning in Expert Systems: A Stochastic Parallel Network Approach," IEEE Computer Society Conference on AI Applications, pp. 13-15 (1985) discusses implementing an expert system for inexact reasoning in a neural network, in which neurons are assigned to facts, constraining relationships between facts are stored as randomly assigned, symmetric interconnections of varying strength between the neurons, and updates of the neurons' states are asynchronous. However, no means for implementing this system in hardware is described. The process allows jumps from a state to lower "energy" states, where the "energy" is determined by the degree of concordance of the neurons' states and the weights of the interconnections between them. Local "energy" minima are thus reached. To attempt to avoid being stuck in local minima, occasional jumps to higher "energy" states are permitted, resulting in a Boltzmann-like distribution of states. The effective "temperature" is reduced in a "simulated annealing" algorithm, and the process is repeated several times to attempt to improve reliability. This system attempts to maximize the concordance among the various units in an inexact reasoning process, not to find precisely valid states in an exact reasoning process.

Kosko, "Adaptive Inference In Fuzzy Knowledge Networks," IEEE First International Conference on Neural Networks pp. II-261 to 268 (June 1987) describes a synchronous implementation of an expert system in a neural network, in which neurons are assigned to facts, and constraining relationships between the facts are represented by the weights of interconnections between the neurons. However, no means for implementing this system in hardware is described. There is feedback with inferencing, and the system reaches a limit cycle when an inferred solution is reached.

The classic Hopfield neural network model arrives at solutions or patterns stored in the network in terms of continuously variable interconnection weights. Known solutions are used to "teach" a Hopfield network these interconnection weights. Once the interconnection weights are determined, the network will converge to the stored pattern closest to a given arbitrary input pattern. This type of system is known as associative memory. Hopfield et al., "Computing With Neural Circuits: A Model," Science, vol. 233, pp. 625-32 (1986).

SUMMARY OF THE INVENTION

A novel neural network implementation for logic systems, for example for a TMS system has been developed. This neural network logic system reduces the computation time needed to generate valid or consistent labellings, when compared with the computation times of previous software implementations. This reduction in computation time is primarily the result of parallel computation in the neural network.

This neural network system may be implemented on an array of very large size, and may thus find valid solutions for complex problems rapidly, more rapidly than previous software implementations. It is particularly suited for use in large, real-time problems, such as in a real-time expert system for testing the consistency of a programmable process controller, or for testing the consistency of an integrated circuit design.

A knowledge base represents rules supplied by the user. Facts are represented by neurons. The knowledge base processes the truth values from all the neurons in parallel. If the result for each neuron is consistent with its prior state, a consistent solution has been reached.

Otherwise, a neuron with inconsistent current and prior states is selected, and the state of that neuron is changed. The process is then iterated, until a stable or consistent solution for all neurons has been reached.

The invention will best be understood from the following description when read in connection with FIGS. 1 and 2.

DETAILED DESCRIPTION OF THE INVENTION

The neural network of this invention is problem-specific, and solves logical problems.

A neural network which updates states simultaneously is called "synchronous," while one with random or sequential updating is called "asynchronous." A neural network is "discrete" if there is an integer number of valid states for each neuron, generally the two binary states "1" and "0," in contrast with continuously variable states. The interconnections in a neural network may be symmetric or asymmetric. The interconnections are symmetric if the weight $W_{ij}$ of connection (i,j) is the same as the weight $W_{ji}$ for connection (j,i). The neural network of this invention is a discrete, asynchronous, asymmetric system.

The neural network logic system of the present invention is different from the classic Hopfield model conceptually as well as architecturally. In the neural network of the present invention, unlike that of the classic Hopfield model, the interconnections are fixed by the user, and solutions are not necessarily known a priori. Moreover, the network is asymmetric, in contrast with the symmetric network of the classic Hopfield model.

The neural network of the present invention includes the following elements: (1) fact representation, (2) knowledge representation, and (3) a labelling or inferencing process.

An embodiment of the invention is described below, along with an example problem. This embodiment of the network has one layer of neurons, which have both inputs and outputs. The interconnections between the neurons are based on the knowledge representation of the system.

Figure 1:
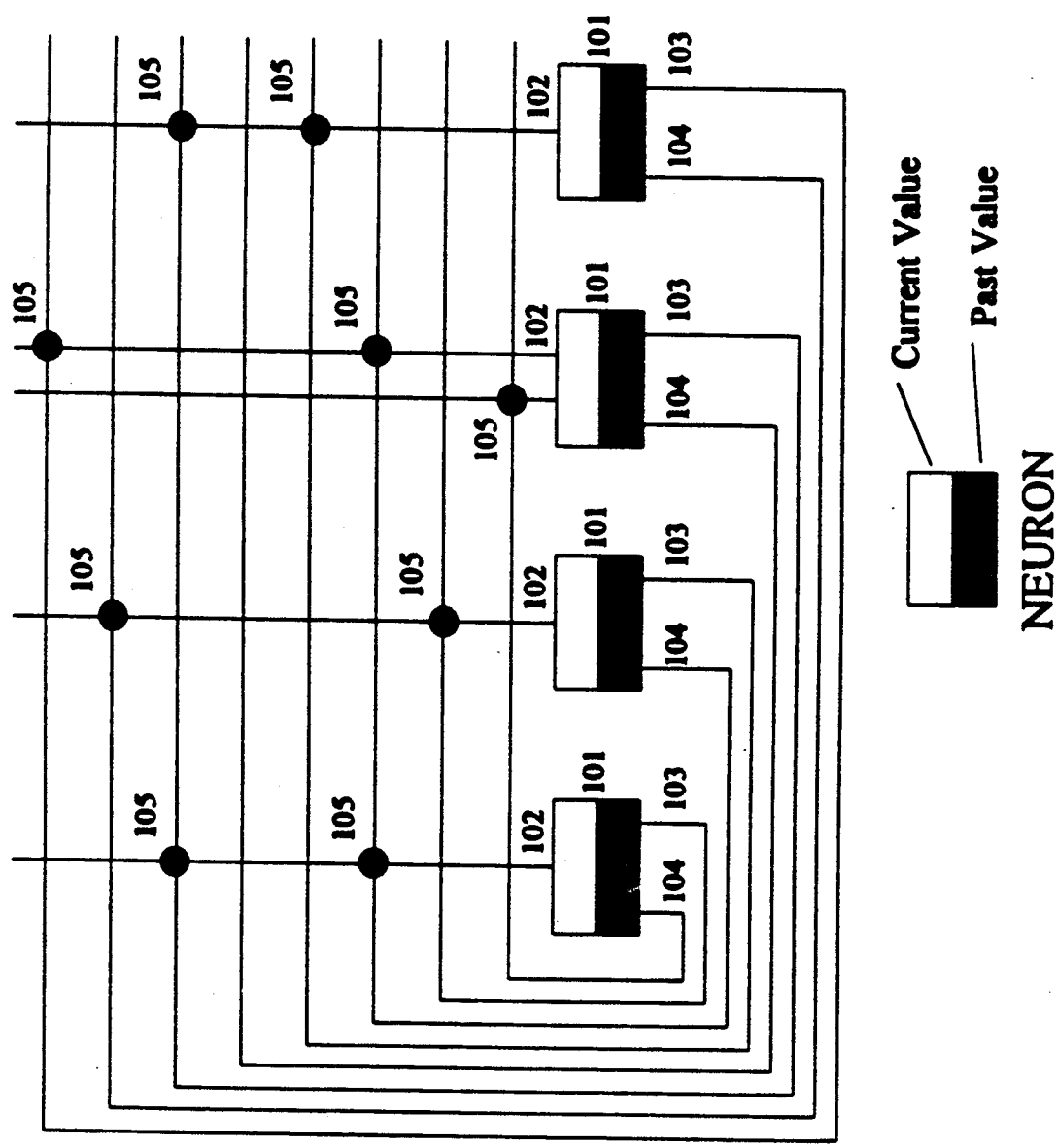
FIG. 1 illustrates basic neural network architecture.

Each neuron represents a fact. As seen from FIG. 1, each neuron 101 (depicted by a partitioned box) has an input state 102, an output state 103, and an inverted output state 104. The input states 102 of all neurons 101 are volatile, i.e., these states are determined by the instantaneous outputs of the knowledge base. The output states 103, on the other hand, store the input state 102 value that was present during the previous triggering from the clock, until another triggering, if any, occurs, at which time the current input state 102 value is stored in output state 103.

The input or output state of a neuron may be either 0 or 1. For simplicity in the circuitry, there are complementary (inverted) neuron outputs 104 in addition to the regular neuron outputs 103. The combined normal and inverted output states of all neurons form the output of the system. The inputs 102 to the neurons come from the knowledge base. The outputs of the neurons are fed back to the knowledge base via nodes 105. The feedback channels enable the knowledge base to process the output state and feed the result back to the neuron inputs. Thus at any instant a neuron's input state represents the current state, while the output state represents the most recent past state. When a neuron is updated or triggered, the current state at its input is transferred to its output. That is, the previous current state becomes the new past state.

Knowledge is represented in the knowledge base by rules supplied by the user. These rules may be represented in the justification format as shown, e.g., by Doyle, supra, for the case of a TMS. A justification, or rule, for a particular fact is a set of truth values of other facts in the database. The truth values in a justification are sufficient conditions to make the associated fact true. A justification will generally not contain a truth value corresponding to its own associated fact, and thus there is usually no self-feedback.

Facts are identified by node numbers or labels 105. A justification is split into two lists, the "TLIST" and the "FLIST." For each justification, the TLIST contains the node labels of the facts which are true, while the FLIST contains the node labels of the facts which are false.

An example for a particular TMS system is illustrated in Table 1 below. There are a total of four facts, and each fact is identified by node labels, in this case the letters I, J, K and L. For example, node I represents fact A. If node L is false, then it can be trivially concluded that node I is true. Hence node L is placed in the FLIST for node I. The TLIST is empty in this particular justification. If node K is false, then "not A" is false, which means that A is true. Therefore node K is also placed in the FLIST. Thus to make node I true, either one of the above two justifications must be satisified. Now consider fact B (node J). It is necessary that node K should be true to make node J true, but this condition alone is not sufficient. In addition, node I could also be made true to make node J true. Therefore one justification for node J consists of nodes I and K in the TLIST. Similarly, it is sufficient that node K be true and node L be false to make node J true.

The mapping of the justifications into network interconnections is straightforward. Each justification list corresponds to one column of interconnections. Each row corresponds to a neuron output state. Each neuron has a normal output as well as a complementary output. There are thus a total of 2N rows. The node labels in a justification list indicate the locations of the interconnections. If a node label is in the TLIST, then an interconnection is made to the normal output row for that neuron. In the example of Table 1, there will be two columns of interconnections corresponding to the two justifications for the first node I. For example, an interconnection is made in one column to the row corresponding to the complementary output of neuron L, and an interconnection is made in another column to the row corresponding to the complementary output of neuron K.

The knowledge base has access to the immediate past truth values of all the neurons. It processes these past truth values in parallel, and computes a current truth value for each neuron. Each neuron therefore has available at any instant both its current state and its immediate past state. The input (current) state of a particular neuron will be determined by the output (past) states of all the other neurons. A valid solution requires consistency among all the input (current) states of all neurons. If the input (current) state of each neuron is identical to its output (past) state, then the current states of all the neurons constitute a valid solution.

The updating mechanism, comprising a pair of switches associated with each neuron, has two functions. First, it allows the update of only one neuron at a time, thereby making the updates asynchronous. Second, it updates a given neuron only if the input state and output state of that neuron are different. So long as there is conflict among the past states, the system will continue searching for a valid solution.

It would also be possible to simplify the circuitry by designing for a straightforward sequential updating, regardless of whether there is a conflict between the input and output of a particular neuron. The circuit would be simpler, but might also be slower.

If one clamps the past or current state of any one or more neurons, the system will search for a valid solution using the clamped truth values for that particular neuron or neurons.

Figure 2:
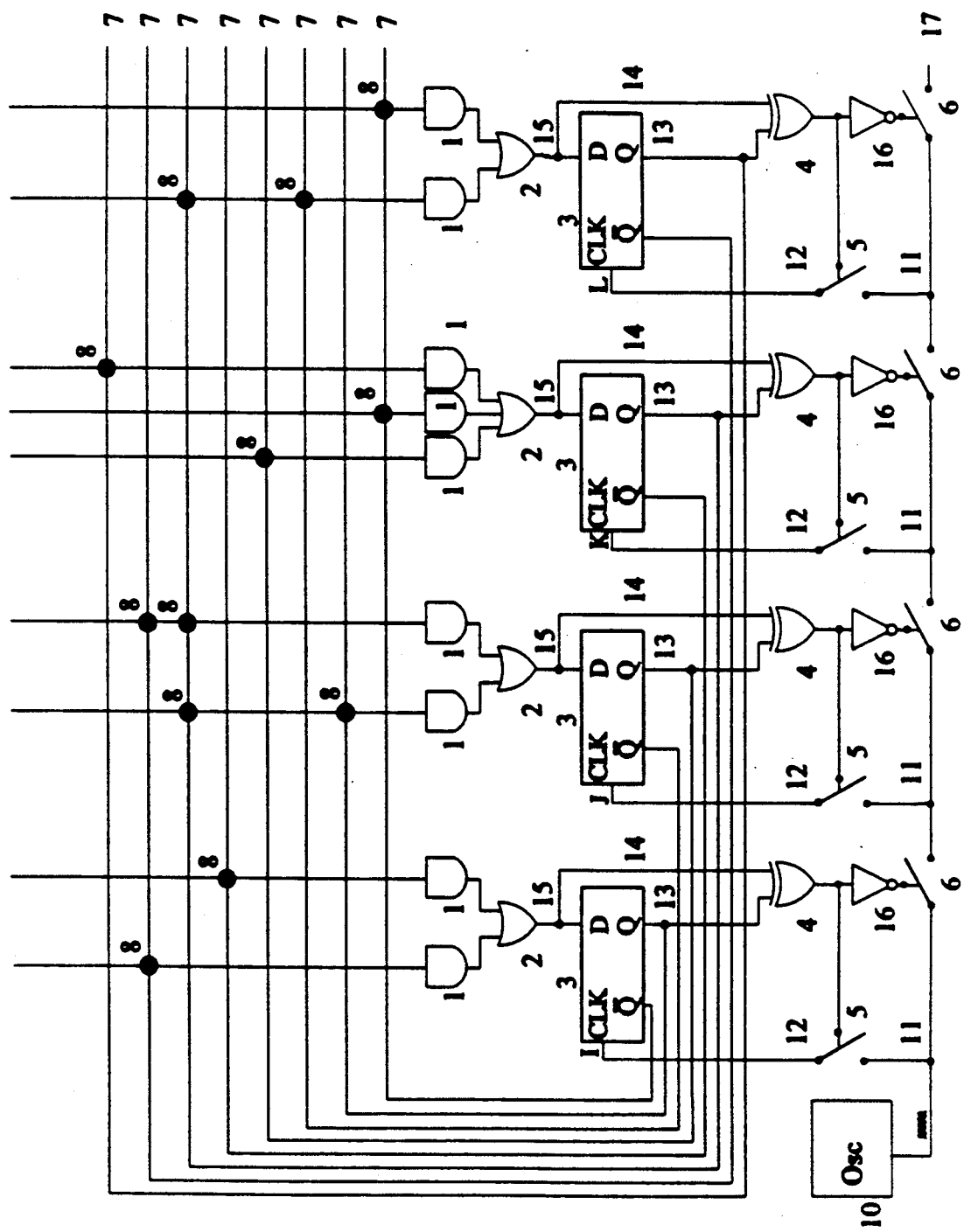
FIG. 2 illustrates an embodiment of the neural network logic system of this invention.

An embodiment of the neural network logic system of this invention using CMOS integrated circuits is shown in FIG. 2. The network comprises AND gates 1, OR gates 2, D-type flip-flops 3, EXCLUSIVE-OR gates 4, switches 5 and 6, conducting lines 7, nodes 8, oscillator 10, conducting lines 11, 12, 13, 14 and 15, inverters 16, and output 17.

AND gates 1 and OR gates 2 are interconnected. The nodes 8 are interconnections between conducting lines 7 and AND gates 1. The nodes 8 on a given AND gate 1 correspond to one rule in the particular logic system. The output of an AND gate 1 will be in state "1" only if the states of all corresponding nodes 8 are satisfied, and will otherwise be in state "0." The output of each AND gate 1 is connected to the input of one OR gate 2. An OR gate 2 will enter state "1" if any of its corresponding AND gates is in state "1," and will otherwise be in state "0." The output of each OR gate 2 is connected by corresponding line 15 to the input of corresponding D-type flip-flop 3. A flip-flop 3, with AND gates 1 and OR gate 2 is a "neuron." (A tap-delay line with an inverter could be used in place of D-type flip-flop 3.) Thus the current state D of a flip-flop 3 is the output of the corresponding OR gate 2. The outputs Q of flip-flops 3 are memory elements which store the most recent past state of the neuron. The outputs Q and inverted outputs ~Q of each neuron are selectively connected to the inputs of any of the AND gates 1 corresponding to every other neuron by lines 7 and nodes 8. It will generally not be necessary or desirable to have a neuron feed back to itself, although it is possible to do so if desired.

Unconnected inputs of the AND gates 1 are set to logic level "1" by connection to pull-up resistors. The unconnected inputs of the OR gates 2 are held at logic level "0" by grounding. The placement of the nodes 8 is determined by the particular knowledge base and logic system.

The network initially stabilizes in accordance with the initial outputs Q and inverted outputs ~Q of flip-flops 3. These initial outputs may either be random, or set to any desired set of states.

The updating process then begins sequentially, from the left in FIG. 2, starting from the first flip-flop 3. However, the order of the updating is not significant, except to the extent that it may influence which of several alternate valid solutions is identified. If the current state at the D input of the first flip-flop 3 is not identical to the past state at the Q output, then the output of EXCLUSIVE OR gate 4 will be "1," switch 6 will be open, and switch 5 will be closed. Thus a pulse from oscillator 10 will reach only the first flip-flop 3, and not any other flip-flop 3.

If, on the other hand, the current state of the first flip-flop 3 is identical to the past state at the Q output, then the output of EXCLUSIVE OR gate 4 will be "0," switch 6 will be closed, and switch 5 will be open. Thus a pulse from oscillator 10 can continue to the second, third, etc. flip-flop 3 until it reaches a flip-flop 3 for which the current state at the D input is not identical to the past state at the Q output.

In this manner, a pulse from oscillator 10 will reach the clock input of the first flip-flop 3 from the left with different past and current states (if any). When this flip-flop 3 is clocked, the current state at the D input of that flip-flop 3 is transferred to the Q output. Once this update occurs, the new value of the Q output can potentially alter some or all of the current states of the other flip-flops 3, depending on both the placement of the particular nodes 8, and the past states of the other flip-flops 3. After a propagation delay, which may be on the order of nanoseconds, the current states of all flip-flops 3 at their D inputs stabilize to their appropriate logic states.

This cycle then iterates until the network becomes stable, if it can-that is, until the past state for each flip-flop 3 is identical to its current state. The described updating procedure is minimal, in the sense that clock pulses for updating are not sent to those flip-flops 3 with identical current and past states. The switches 5 and 6 associated with a given flip-flop 3 direct pulses from oscillator 10 to that flip-flop 3 or to other flip-flops 3, depending on the past and current states of the particular flip-flop 3. This switching arrangement allows only one neuron at a time to be updated. This circuitry automatically causes the updating sequence to iterate, each cycle updating the flip-flop 3 "nearest" oscillator 10 having nonidentical current and past states. Note that the order of updating described here is that resulting from the circuit shown in FIG. 1. However, the order of updating is inconsequential, and may even be random. (The order of updating may affect which one of multiple valid solutions will be found, but not whether a valid solution will be found)

If stability is reached, then all switches 5 will be open, all switches 6 will be closed, no further updating will occur, and pulses from oscillator 10 will appear at output 17. The set of current or past states of the flip-flops 3 may then be read, and will represent a valid solution. If there is no valid solution, oscillator pulses will never appear at output 17.

One or more flip-flops 3 may be clamped to remain in the "1" or "0" state, for example by means of SET or RESET inputs (not shown). The system then searches for a valid solution consistent with these clamped values, if such a solution exists. Otherwise, the system will not converge. The validity of a particular solution may similarly be tested by clamping the values of each flip-flop to correspond with the particular solution, and observing whether clock pulses appear at output 17.

EXAMPLE

The nodes 8 shown in FIG. 2 represent TMS justifications for the set of logical terms "A," "B," "A implies B," and "not A." Each of these four logical terms is represented by one neuron or flip-flop; "A" is represented by neuron I, "B" by neuron J, "A implies B" by neuron K, and "not A" by neuron L.

A set of justifications for these terms may be found by standard means, such as those of Doyle, supra. Such a set of justifications is shown in Table 1.

TABLE 1

| Term | Neuron | Justifications TLIST | FLIST |
|---|---|---|---|
| A | I |  | L |
|  |  |  | K |
| B | J | I, K |  |
|  |  | K | L |
| A implies B | K | J |  |
|  |  |  | I |
|  |  | L |  |
| not A | L | K | J |
|  |  |  | I |

Each justification list corresponds to the nodes 8 for the inputs to one AND gate 1 in FIG. 2. If a fact is listed in the TLIST of a justification, then the corresponding Q output is used; if a fact is listed in the FLIST of a justification, the corresponding inverted Q output is used. It is readily seen that the justifications given in table 1 are represented by the connections shown in FIG. 2.

The valid solutions for this example, found by inspection or by software implementation, are TFFF, FFTT, and TTTF. A conventional labelling algorithm, such as one implemented in Lisp, required more steps than did the neural network of this invention to arrive at a valid solution.

In a TMS system, FTTT is not a valid solution, although it would be a valid solution for a conventional truth-table logic system. The reason for this difference is that a truth maintenance system imposes a condition in addition to those for a conventional truth-table logic system, namely that the truth of any "true" term must be unambiguously determined by the truth values of the remaining terms; no such condition is imposed on a false term. In the case of FTTT, the truth of the second term ("B") is not uniquely determined by the truth values of the remaining terms—i.e., FFTT is also logically self-consistent. Therefore, FTTT is not a valid solution in a truth maintenance system. However, FFTT is a valid solution, because the falsity of the second term need not be unambiguously determined by the truth values of the remaining terms.

This distinction between the two types of logical systems illustrates the power of the present invention, which can handle either logic system, or many other possible logic systems, by choosing an appropriate set of rules or justifications. The justifications of the above example correspond to a truth maintenance system. A different set of justifications would correspond to a conventional truth-table system, and still other sets of justifications would correspond to other logic systems. The hardware of the present invention will find valid solutions for any type of logic system which can be expressed in this justification format.

Use of the present invention with a conventional truth-table logic system could be used to validate (i.e., check the internal consistency of) programmable process controllers, very large scale integrated circuit chips, etc.

A TMS system may be used, for example, to test or maintain the consistency of an "expert system." If the knowledge incorporated in such a system is complex, it can be a non-trivial problem to determine whether the knowledge is consistent, i.e., whether there exist any valid solutions or labelings for the system. Without testing for consistency, problems in an expert system can arise unpredictably.

An expert system generally consists of a rule database, and an inference "engine." As more rules are added to the database, a possibility arises for a conflict between new rules and older rules in the database. Such inconsistency may lead to faulty or indeterminate inferences.

A TMS can itself be used as an expert system. For example, in a system containing facts 1,2,..., N already known to be consistent, the truth of the expression "Fact 1 and Fact 2 imply Fact 3" can be tested by clamping its negation—Fact 1 (true), Fact 2 (true), and Fact 3 (false). If the system arrives at a consistent solution, then the original expression is false. If the system fails to converge to a solution, from observations to date it is believed that this failure necessarily implies that the original expression is true, although this last statement has not been proven by the inventors as of the filing date of this application.

More generally, inferences may be made by clamping appropriate truth values, and observing any convergent solutions that result.

The nodes corresponding to a particular set of justifications may be introduced in a variety of ways. The nodes could be permanently hard-wired by the manufacturer; they could be supplied by the user, either reversibly, analogously to writing on an EEPROM, or irreversibly, analogously to writing on a PROM; or they could be supplied from the memory of another circuit element, again either reversibly or irreversibly.

A breadboard implementation of the circuit of FIG. 2 was constructed from CMOS integrated circuits. Light emitting diodes were used to indicate the outputs of the flip-flops. The valid solutions found were TFFF, FFTT, and TTTF. The oscillator frequency could be slowed to 1 Hz, to allow one to visually observe the updates.

With no clamping, each time the circuit was switched on the network began with a random set of truth values for the past states of each neuron, and subsequently arrived at one of the three stable states. A solution was observed almost instantaneously when the clock speed was stepped up to 1 MHz.

Clamping one or more flip-flops, and the associated EXCLUSIVE OR inputs, to either a true or a false value forced the network to seek a valid solution, if one existed, consistent with the clamped values. When neuron I and neuron L were both clamped to "1," an invalid labelling, the network never stabilized, as was expected.

For very large problems, a stable (i.e., unchanging) solution can be found rapidly, using a higher oscillator frequency. The high speed of inferencing lends this novel system to applications for real-time expert systems. This neural network logic system is well-suited for implementation on a VLSI chip. It is also suitable for verifying the consistency of VLSI circuit designs. The oscillator period should not be faster than the effective settling time of the circuit components.

An AND gate is any physical, electrical, or electronic device with an output and one or more inputs, wherein the output is "true" if and only if each input is "true," and otherwise is "false."

An OR gate is any physical, electrical, or electronic device with an output and one or more inputs, wherein the output is "false" if and only if each input is "false," and otherwise is "true."

An EXCLUSIVE OR gate is any physical, electrical, or electronic device with an output and one or more inputs, wherein the output is "true" if and only if one and only one input is "true," and otherwise is "false."

The inverse of a "true" value is "false," and the inverse of a "false" value is "true."

A "switch" is any physical, electrical, or electronic device which closes a connection in response to a "true" trigger input, but keeps the connection open in response to a "false" trigger input, or vice versa. For example, a digital switch may be an AND gate with two inputs, in which one input is used as the trigger, and the other input, together with the output, are the connection in question—open in response to a "false" trigger, and closed in response to a "true" trigger.

The "nodes" of the present invention may be switches, and in particular, may be implemented with AND gates, as discussed above.

It is intended that this invention includes any equivalents to the descriptions contained in the specification and claims, such as would result from a transformation of logic elements by DeMorgan's Theorem, or as would result from substituting equivalent circuit elements, for example substituting op amps with appropriate reference voltages for AND gates 1 in FIG. 2.

It is intended that the apparatus claims be interpreted to read only on physical apparatus, and not to read on any purely abstract mathematical formula or algorithm which is not embodied in some physical apparatus. It is intended that the process claims be interpreted to read only on processes implemented in physical apparatus, and not to read on any purely abstract mathematical formula or algorithm which is not embodied in some physical apparatus.

We claim:

1. A circuit which comprises:
   (a) a plurality of logic elements, each logic element comprising:
       (i) a first input;
       (ii) a memory element;
       (iii) means for selectively storing the value of said first input in said memory element;
   (b) a plurality of OR gates, at least one of said OR gates having at least one second input and having a first output, said first output being connected to at least one of said first inputs;
   (c) a plurality of AND gates, at least one of said AND gates having at least one third input, and having a second output, said second output being connected to at least one of said second inputs;
   (d) means for selectively connecting said memory elements to said third inputs;
   (e) means for selectively connecting the inverses of said memory elements to said third inputs;
   (f) means for selecting one of said logic elements; and
   (g) means responsive to said selecting means for activating said selective storing means of said selected logic element.

2. A circuit as recited in claim 1, wherein said selecting means comprises:
   (a) a plurality of means, one associated with each of said logic elements, for comparing whether said first input is equal to the state of said memory element;
   (b) means for selecting one of said logic elements for which said comparing means indicates inequality, when at least one of said comparing means indicates inequality.

3. A circuit as recited in claim 2, wherein said comparing means comprises an EXCLUSIVE OR gate having inputs connected to said memory element and to said first input.

4. A circuit as recited in claim 2, wherein at least one of said logic elements comprises a D-type flip-flop.

5. A circuit as recited in claim 2, wherein at least one of said logic elements comprises a tap-delay line.

6. A circuit as recited in claim 2, wherein each of said first inputs is connected to one of said first outputs.

7. A circuit as recited in claim 2, wherein each of said second inputs is connected to at least one of said second outputs.

8. A circuit as recited in claim 2, wherein said selective connecting means corresponds to a set of rules for a knowledge base and a logic system.

9. A circuit as recited in claim 8, wherein said logic system is conventional truth-table logic.

10. A circuit as recited in claim 8, wherein said logic system is a truth maintenance system.

11. A circuit as recited in claim 2, additionally comprising means for outputting the values of each of said memory elements.

12. A circuit as recited in claim 2, additionally comprising means for outputting the values of each of said first inputs.

13. A circuit as recited in claim 2, additionally comprising means for selectively clamping at least one of said first inputs to a desired value.

* * * * *